United States Patent [19]
Thomas et al.

[11] Patent Number: 5,484,262
[45] Date of Patent: * Jan. 16, 1996

[54] LOW PROFILE FAN BODY WITH HEAT TRANSFER CHARACTERISTICS

[75] Inventors: Daniel L. Thomas, San Jose, Calif.; John W. Hoover, Huntington; Charles R. Marracino, Torrington, both of Conn.

[73] Assignee: Nidec Corporation, Torrington, Conn.

[*] Notice: The portion of the term of this patent subsequent to Feb. 22, 2011, has been disclaimed.

[21] Appl. No.: 199,331

[22] Filed: Feb. 22, 1994

Related U.S. Application Data

[63] Continuation-in-part of Ser. No. 965,654, Oct. 23, 1992, Pat. No. 5,288,203.

[51] Int. Cl.$^6$ .................................................. F04D 29/58
[52] U.S. Cl. ...................... 415/178; 165/80.3; 165/125; 361/697
[58] Field of Search ....................... 415/178, 208.4, 415/186, 208.5; 165/80.3, 125; 361/695, 697

[56] References Cited

U.S. PATENT DOCUMENTS

| | | |
|---|---|---|
| 3,686,533 | 8/1972 | Garnier et al. . |
| 4,194,556 | 3/1980 | Watanabe et al. . |
| 4,233,644 | 11/1980 | Hwang et al. . |
| 4,489,363 | 12/1984 | Goldberg . |
| 4,541,004 | 9/1985 | Moore . |
| 4,546,405 | 10/1985 | Hultmark et al. . |
| 4,611,238 | 9/1986 | Lewis et al. . |
| 4,620,216 | 10/1986 | Horvath . |
| 4,662,830 | 5/1987 | Pottebaum ............................ 417/424 |
| 4,682,651 | 7/1987 | Gabuzda . |
| 4,715,430 | 12/1987 | Arnold et al. . |

(List continued on next page.)

FOREIGN PATENT DOCUMENTS

| | | |
|---|---|---|
| 2743708 | 9/1977 | Germany . |
| 63-113460 | 7/1988 | Japan ..................................... 361/697 |
| 2-286900 | 11/1990 | Japan . |
| 3-229492 | 10/1991 | Japan ..................................... 361/697 |

OTHER PUBLICATIONS

Literature re Thermalloy TCM™ by Thermalloy, Inc., 1 sheet.
"Velox Backgrounder" by Velox Computer Technology, Inc., 6 sheets.
R. Mitchell, "The Experimental Step 486/50 Redefines Cool", *BYTE*, Dec. 1990, 1 sheet.
"ICEJET™", 50 MHz 486 Computer System Board, by Velox Computer Technology, Inc., 1 sheet.
Literature re Velox "ICECAP™" by Velox Computer Technology, Inc., 10 sheets.

*Primary Examiner*—Edward K. Look
*Assistant Examiner*—Michael S. Lee
*Attorney, Agent, or Firm*—McCormick, Paulding & Huber

[57] ABSTRACT

A low profile fan body for cooling an electronic component has a fan frame supporting a fan, which is mounted on a fan base forming a heat sink or heat transfer body. The fan has plurality of fan blades received within a plenum chamber defined within the heat sink. Each fan blade defines a first axial edge, a second axial edge on a substantially opposite side of the blade relative to the first axial edge, and a radial edge extending between the first and second axial edges. The heat sink defines a base portion for engaging an exposed surface of the electronic component, and a plurality of heat fins spaced relative to each other along the periphery of the sink and defining the plenum chamber. A pressure differential surface is disposed between the radial edges of the fan blades and the fins for directing air flow in the axial direction of the fan. The radial edges of a plurality of the fan blades are at least partially exposed to the adjacent heat fins defining a flow path for cooling air across the radial edges exposed to the heat fins. The first axial edges of the fan blades are located adjacent to and spaced from the base portion of the heat sink, defining an additional flow path for cooling air between the first axial edges and the base portion.

46 Claims, 10 Drawing Sheets

U.S. PATENT DOCUMENTS

| | | | |
|---|---|---|---|
| 4,733,293 | 3/1988 | Gabuzda . | |
| 4,812,733 | 3/1989 | Tobey . | |
| 5,000,254 | 3/1991 | Williams | 361/697 |
| 5,019,880 | 5/1991 | Higgins, III | 361/694 |
| 5,029,236 | 7/1991 | Yasuda et al. | 361/697 |
| 5,191,230 | 3/1993 | Heung | 307/141 |
| 5,272,599 | 12/1993 | Koenen | 361/710 |
| 5,287,249 | 2/1994 | Chen | 361/718 |
| 5,288,203 | 2/1994 | Thomas | 415/178 |
| 5,297,617 | 3/1994 | Herbert | 361/697 |
| 5,299,632 | 4/1994 | Lee | 361/697 |
| 5,309,983 | 5/1994 | Bailey | 361/697 |
| 5,335,722 | 8/1994 | Wu | 361/697 |
| 5,353,863 | 10/1994 | Yu | 361/697 |

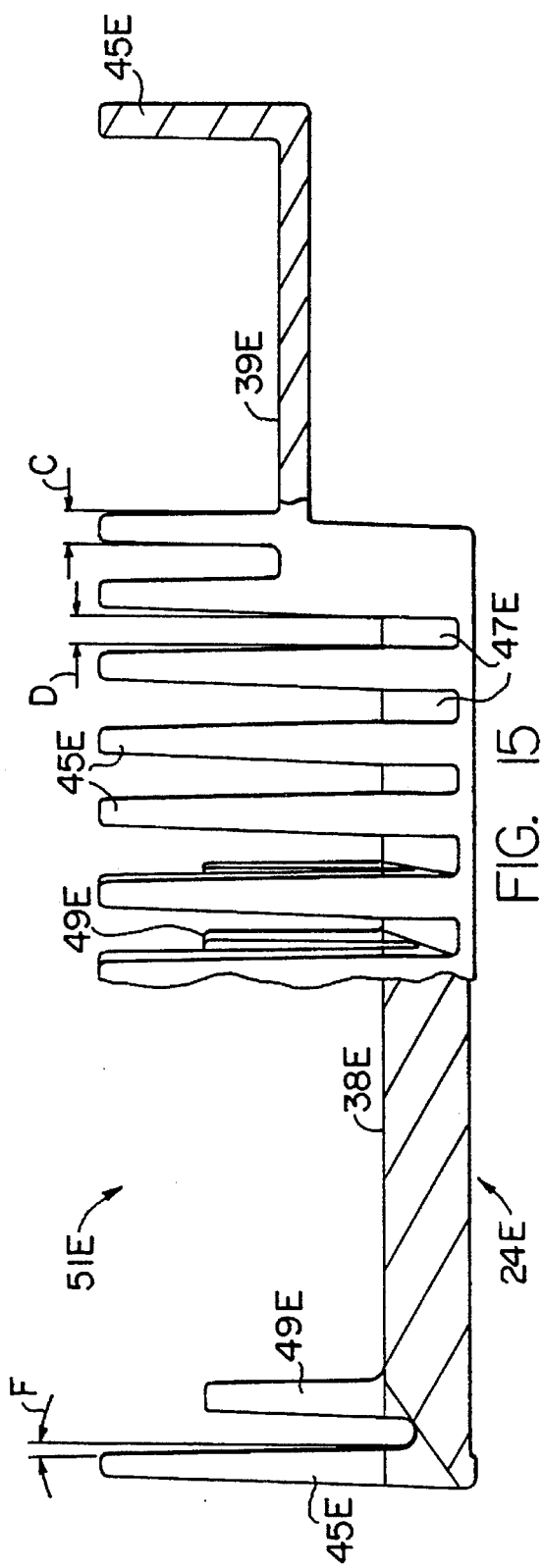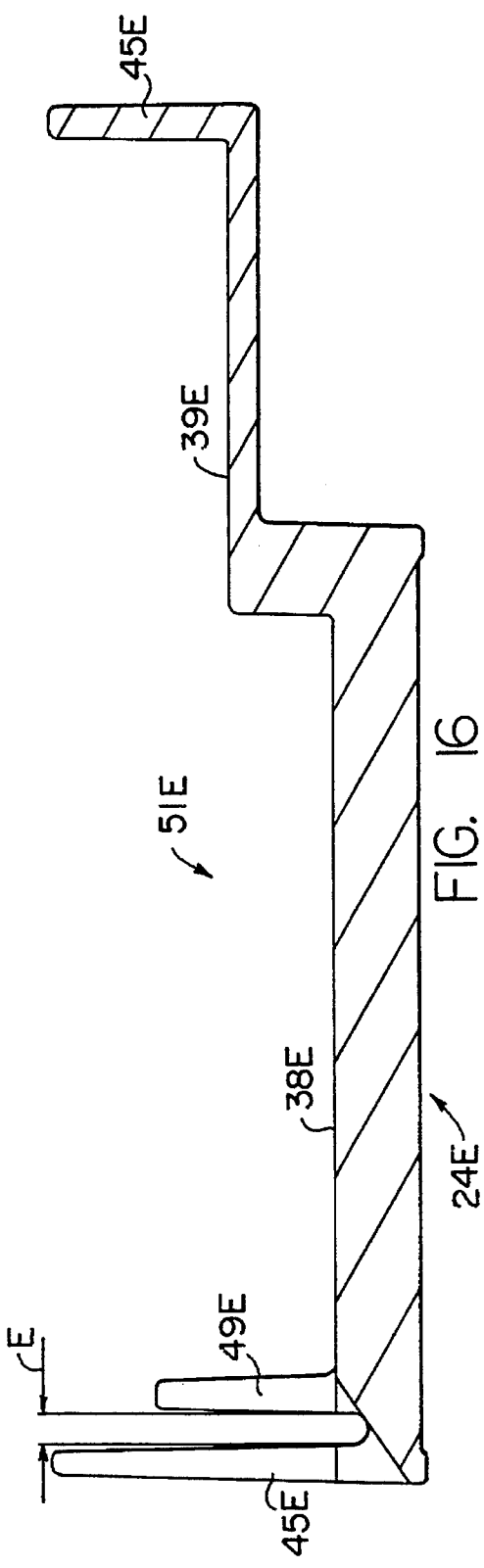

LOW PROFILE FAN BODY WITH HEAT TRANSFER CHARACTERISTICS

CROSS-REFERENCE TO RELATED APPLICATION

This patent application is a continuation-in-part of U.S. patent application Ser, No. 07/965,654, now U.S. Pat. No. 5,288,203, filed Oct. 23, 1992, herewith.

BRIEF DESCRIPTION OF THE INVENTION

This invention relates generally to the cooling of electronic components. This invention more particularly relates to a low profile fan body with heat transfer characteristics which is positioned on an electronic component which is to be cooled.

BACKGROUND OF THE INVENTION

Semiconductors are continuously diminishing in size. Corresponding to this size reduction is an increase in the power densities of the semiconductors. This, in turn, creates heat proliferation problems which must be resolved. The prior art is replete with devices which are used to remove heat from semiconductors. For example, air-cooled finned heat sinks, thermosiphons, fans, plungers, and liquid-cooled heat sinks are typically employed in the prior art. A salient shortcoming of such devices is that they have a relatively large vertical profile. As a result, they are difficult to use in compact electronic equipment such as palm, notebook, lap and desktop computers. The size of prior art cooling devices also discourages their utilization in other contexts such as for cooling power supplies. Thus, it would be highly advantageous to provide an efficient cooling device without the size limitations associated with prior art devices.

Prior art attempts have been made to cool electronic devices (semiconductors, power supplies and analogous heat generating devices) by combining heat sinks with fans. First, the combination of these elements has previously rendered a high profile device. In addition, prior art combinations of fans and heat sinks have not resulted in optimal heat transfer characteristics. For example, prior art fans use either a full venturi around the fan blades or eliminate the venturi altogether. When the venturi is eliminated altogether by placing a fan directly on a heat sink, it is difficult to obtain optimal air movement over the heat sink. If a full venturi is used, it is difficult to reduce the vertical fan profile. It would be advantageous to develop a device which enjoys the air movement benefits associated with a venturi, but which is not hindered by the concomitant vertical profile problem associated with a venturi.

OBJECTS AND SUMMARY OF THE INVENTION

It is a general object of the present invention to provide an electronic component cooling device.

It is a related object of the invention to provide an electronic component cooling device which has a low profile body with favorable heat transfer properties.

It is another object of the invention to provide an electronic component cooling device which can be used in compact electronic equipment such as palm, notebook, lap, and desktop computers.

It is a related object of the invention to provide an electronic component cooling device which can be efficiently used for power supplies and other heat generating devices.

It is another object of the invention to provide an electronic component cooling device which exploits the air movement benefits of a venturi while withstanding the vertical profile limitations associated with prior art venturies.

These and other objects are obtained by an electronic component cooling low profile fan body with favorable heat transfer characteristics. A fan, positioned in the body, includes a number of blades circumferentially formed around a central axis. The blades establish an axial blade depth region in reference to the central axis. The low profile fan body includes a frame supporting the fan. In one embodiment of the invention, the heat transfer body includes a pressure differential surface formed around the outer perimeter of the fan blades within a first segment of the axial blade depth region. An interface surface for connection to the electronic component is positioned opposite of the fan frame. A number of heat transfer devices are disposed between the frame and the interface surface, such that the heat transfer devices are positioned within a second segment of the axial blade depth region. In an alternate embodiment of the invention, heat transfer devices are disposed between the frame and the interface surface, without a pressure differential surface, along the entire axial blade depth region. The configuration of the heat transfer devices allows them to function as both a heat transfer surface and a pressure differential surface.

In another embodiment of the invention, the heat transfer body includes a plurality of heat transfer members projecting from the interface surface in substantially the axial direction of the fan and defining a plenum chamber receiving the fan blades. A pressure differential surface is disposed between the radial edges of a plurality of the fan blades and a plurality of the heat transfer members. The radial edges of a plurality of the fan blades are at least partially exposed to the adjacent heat transfer members, thereby defining an air flow path across the radial edges of the fan blades exposed to the heat transfer members. The axial edges of the fan blades facing the interface surface are located in close proximity to, but spaced away from the interface surface a sufficient distance to further define an air flow path across the respective axial edges, and to prevent choking or cavitation between the axial edges of the fan blades and the interface surface.

One advantage of the present invention, is that the fan blades are received within the plenum chamber defined within the heat transfer body, and the heat transfer body and fan portions define substantially equal dimensions in the axial direction of the fan, or in a direction normal to an exposed surface of an electronic component. The present invention thus provides a low profile fan body particularly suitable for use in small spaces, such as in palm, notebook, lap and desktop computers.

BRIEF DESCRIPTION OF THE DRAWINGS

For a better understanding of the nature and objects of the invention, reference should be made to the following detailed description taken in conjunction with the accompanying drawings, in which:

FIG. 15 is an elevational view, in partial cross-section, of the fan base of FIG. 14.

FIG. 16 is a cross-sectional of the fan base taken along line 16—16 of FIG. 14.

Like reference numerals refer to corresponding parts throughout the several views of the drawings.

DETAILED DESCRIPTION OF THE INVENTION

Figure 1:
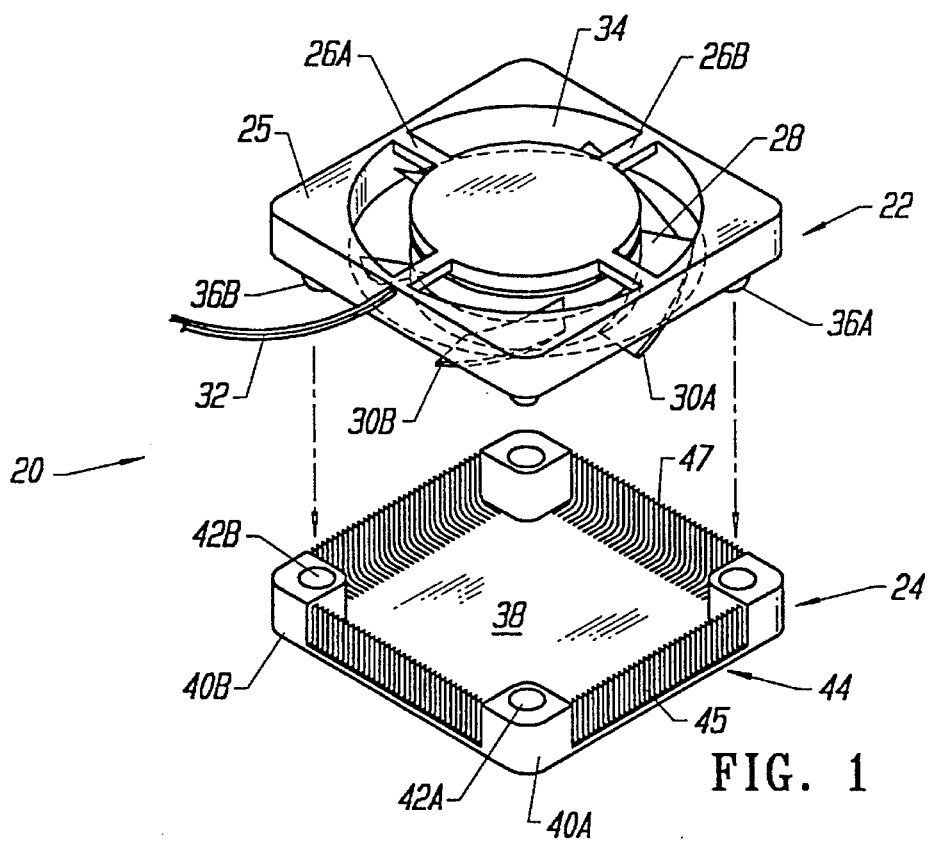
FIG. 1 is an exploded view of the fan-frame member and the fan-base member of a first embodiment of the low profile fan body of the invention.

FIG. 1 provides an exploded view of a low profile fan body 20, with heat transfer characteristics in accordance with the invention. The low profile fan body 20 includes a fan-frame member 22 and a fan-base member 24. In this embodiment, the fan-frame member 22 includes a fan-frame member body 25 and a number of struts 26 to support a fan 28, which includes a motor and corresponding circuitry. Fan 28 includes a number of fan blades 30 and is energized by a power line 32. As used herein, the term "fan" means any fluid movement device. The fan-frame member 22 preferably includes interconnection posts 36 for coupling with the fan-base 24.

As will be more fully described below, in this embodiment of the invention, the fan-frame member 22 includes a discrete air pressure differential surface 34 which extends only a fraction of the axial depth defined by the fan blades 30. Thus, the fan blades 30 extend into the fan-base member 24.

The fan-base member 24 includes an interface surface 38. At the corners of the interface surface 38 are vertical support members 40 defining post receptacles 42. On the outer perimeter of the interface surface 38 is an optimized heat transfer surface 44, which in this embodiment comprises a number of finely pitched posts 45, defining slots 47 therebetween.

Figure 2:
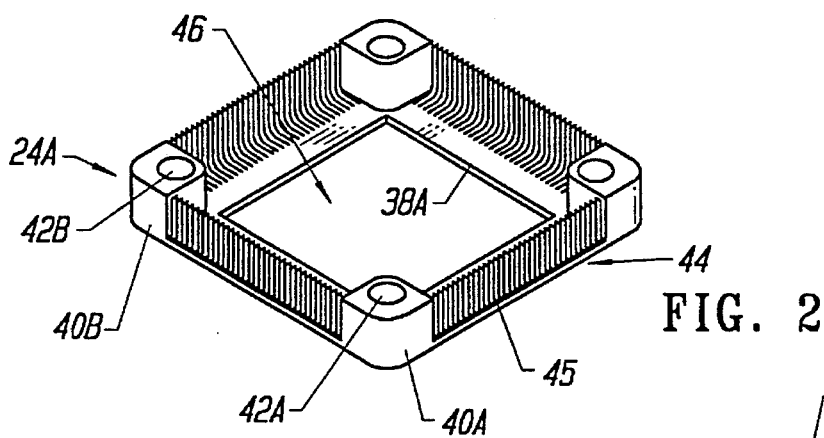
FIG. 2 is a perspective view another embodiment of the fan-base member of the invention; in this embodiment, the fan-base member interface surface is a perimeter interface surface.

FIG. 2 depicts an alternate embodiment 24A of the fan-base member 24. In this embodiment, the interface surface 38A is in the form of a perimeter surface. Thus, the interface surface 38A forms a large fan-base aperture 46. As will be more fully described below, a fan-base member 24 is positioned on a heat generating electronic component. In the embodiment of FIG. 2, the fan-base aperture 46 allows direct air movement over a heat generating electronic component.

Figure 3:
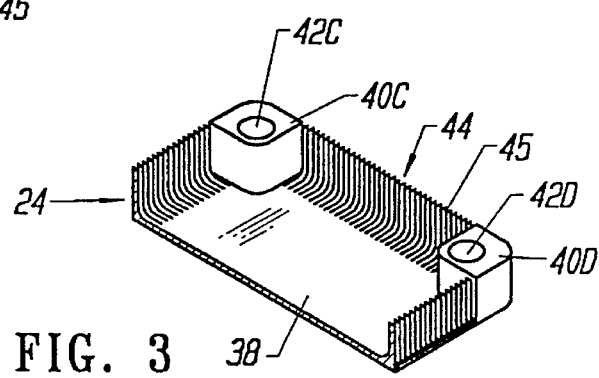
FIG. 3 is an enlarged cut-away view of the fan-base member of FIG. 1.

FIG. 3 provides a cut away view of the fan-base member 24 of FIG. 1, and clearly depicts the solid interface surface 38.

Figure 4:
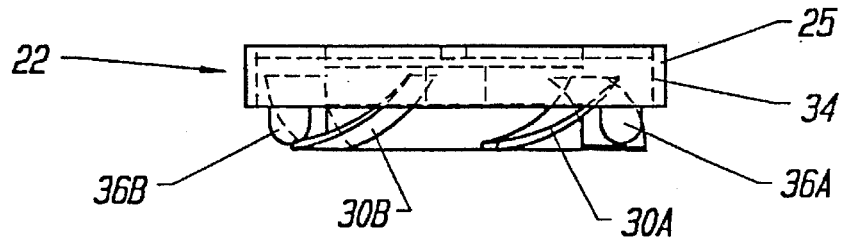
FIG. 4 is a side view of the fan-frame member of FIG. 1 showing a pressure differential surface formed therein.

FIG. 4 depicts a side view of one embodiment of the fan-frame member 22 of the invention. FIG. 4 also shows, in phantom, an air pressure differential surface 34. As shown in FIGS. 1 and 4, the air pressure differential surface 34 is a vertical surface formed around the outer perimeter of the fan blades 30. In this embodiment, the air pressure differential surface 34 is the same vertical height as the fan-frame member body 25. As depicted in FIG. 4, the fan blades 30 have a greater axial height than the fan-frame member body 25 and its corresponding air pressure differential surface 34. Consequently, the fan blades 30 extend below the fan-frame member 22.

Figure 5:
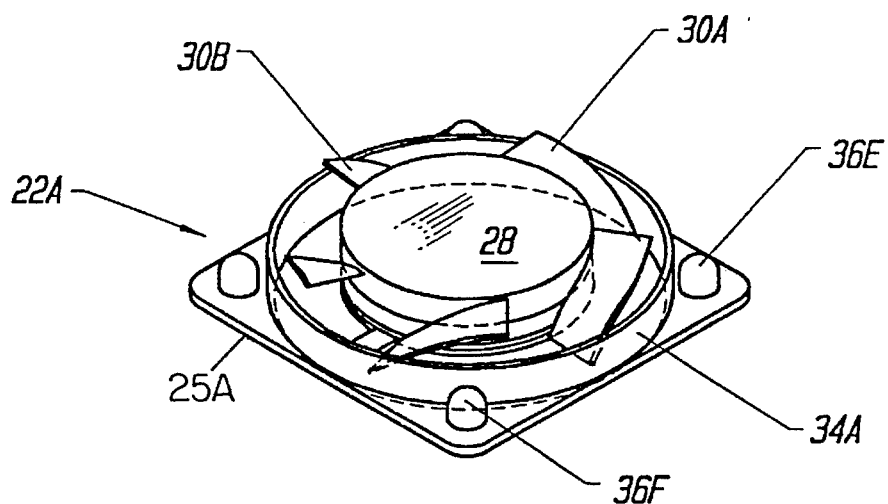
FIG. 5 is a perspective view of another embodiment of the invention defining a shallow fan-frame member with a protruding pressure differential surface extending therefrom.

An alternate embodiment 22A of the fan-frame member of the invention is depicted in FIG. 5. In this embodiment, the fan-frame member body 25A has a very thin vertical profile. The fan-frame member body 25A supports a protruding air pressure differential surface 34A. In a preferable embodiment, the air pressure differential surface 34A has a vertical, or axial height which is less than that of the fan blades 30. In other words, as in the case of the fan-frame member 22 of FIG. 4, the fan blades 30 extend beyond the axial depth of the air pressure differential surface 34.

Figure 6:
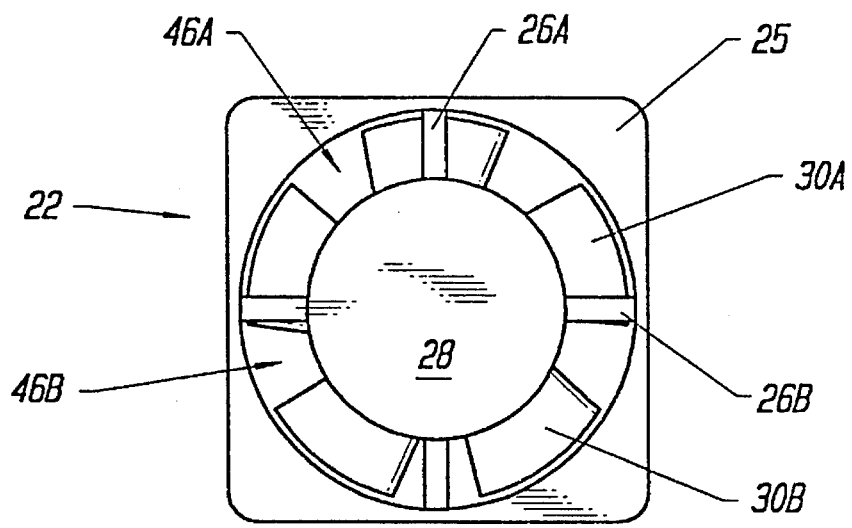
FIG. 6 is a top view of the fan-frame member of FIG. 1.

FIG. 6 is a top view of the fan-frame member 22. Note that the fan-frame member 22 forms large fan-frame apertures 46. Fan 28 provides axial air flow through the fan-frame apertures 46.

Figure 7:
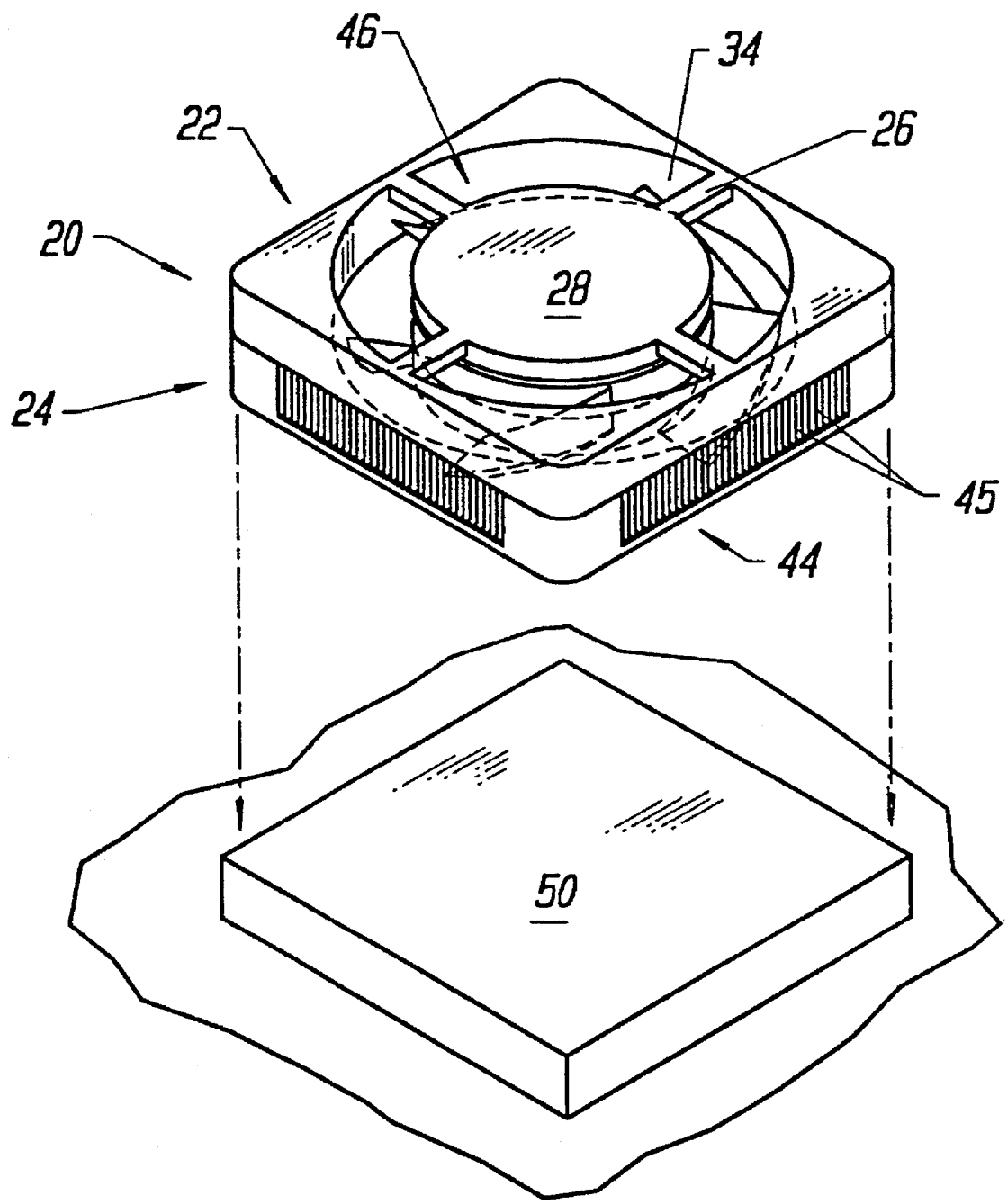
FIG. 7 is a perspective view of the fan-frame member and the fan-base member of FIG. 1 attached to form a low profile fan body which is used to cool an electronic component.

FIG. 7 is an exploded view showing the invention's low profile fan body 20 being positioned on a heat generating electronic component 50. The apparatus 20 efficiently removes heat from the electronic component 50 in the following manner. The fan 28 produces a low pressure region adjacent to the optimized heat transfer surface 44 and a high pressure region at the fan apertures 46. As a result, ambient air is blown in through the optimized heat transfer surface 44 toward the low pressure region created by the fan 28. The fan blades 30 then transport the air to the high pressure region near the fan apertures 46, at which point it blows out into the ambient environment.

The apparatus 20 of the present invention departs from prior art fan bodies in a number of respects. First, as previously stated, the fan blades 30 extend below the air pressure differential surface 34 and are received within the heat transfer passageway formed within the fan-base member or heat transfer body 24. Thus, the air pressure differential surface 34 only occupies a segment of the axial blade depth region. Second, the optimized heat transfer surface 44 is also in the axial blade depth region. This configuration allows for a low profile fan body with favorable heat transfer properties. The favorable heat transfer properties are produced by the air pressure differential surface 34. Although the invention merely utilizes a partial air pressure differential surface 34, effective heat transfer properties are still obtained because the fan blades 30 cause air to circulate at the axial base of the fan blades 30 within the portion of the heat transfer passageway between the fan blades and the interface surface 38. This circulating air is in close contact with the interior portion of the optimized heat transfer surface 44, which thereby serves to force the air in an axial direction.

An important functional attribute of the present invention is that both the pressure differential surface 34 and the optimized heat transfer surface 44 are positioned within, and adjacent to, the axial blade depth region. Thus, a low profile fan body 20 can be achieved wherein the heat transfer body or fan-base member 24 and the air moving means or fan 28 define substantially equal dimensions in a direction normal to the interface surface 38 or in the axial direction of the fan. For example, as shown in the embodiments of FIGS. 1–4, the posts 45 of the heat transfer surface 44 terminate in the axial direction of the fan 28 substantially the same distance from the base portion or interface surface 38 as the fan blades 30. Similarly, as shown in FIG. 5, the fan frame member body 25A terminates in the axial direction of the fan 28 substantially the same distance from the interface surface 38 as the posts 45. In each case, the fan blades are received within the heat transfer passageway formed within the fan-base member 24, and the substantially equal dimensions of the fan and fan-base member in the fan's axial direction give the overall fan body a relatively low vertical (or axial) profile in comparison to prior art cooling devices in which the fans are mounted on top of, as opposed to being received within, the heat sinks or heat transfer bodies. The low profile fan bodies of the present invention are therefore particularly suitable for cooling modern microprocessors mounted within compact electronic equipment.

Favorable heat transfer characteristics are also realized with the present invention because the pressure differential surface is acting as a partial venturi surface, while the heat transfer surface is simultaneously serving as a heat transfer surface and a partial venturi surface. One skilled in the art will recognize that any combination of air pressure differential surface axial lengths and optimized heat transfer surface axial lengths may be employed within the ambit of the invention.

Note that in the embodiment of FIG. 7, the fine pitch of the slots 47 within the optimized heat transfer surface 44 serve to prevent fine particulate from collecting on the fan blades 30 or the fan 28. In other words, the fine particulate accumulates on the posts 45 and slots 47, rather than on the fan blades 30 or the fan motor 28. Particulate can be readily removed from the posts 45 and slots 47.

Figure 8:
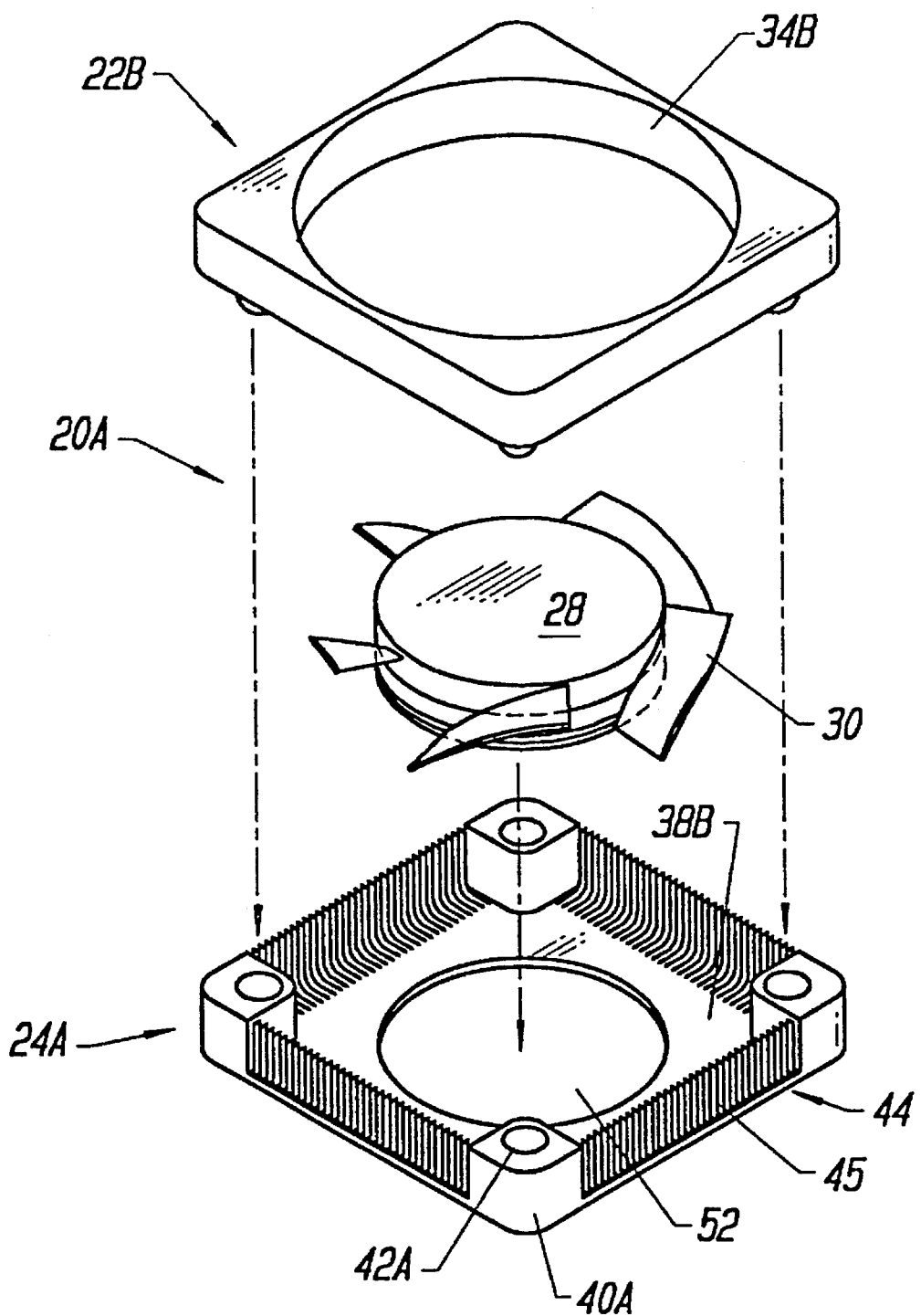
FIG. 8 is an exploded view of another embodiment of the invention including a fan motor which is positionable within a fan-base member which includes an aperture for receiving the fan motor.

FIG. 8 provides an alternate embodiment 20A of the apparatus of the invention. In this embodiment, the fan-base member 24A has an interface surface 38B which forms a fan receptacle 52 for receiving and supporting fan 28. The fan-base member 24A does not require a fan receptacle, rather the fan 28 may be simply mounted on the interface surface 38B, or it may be mounted on a plateau formed in the interface surface 38B The fan-frame member 22B includes an air pressure differential surface 34B. This embodiment of the invention operates in a manner consistent with the embodiment of FIG. 7. This embodiment of the invention may also be practiced without the use of the fan-frame member 22B. In such an embodiment, only the heat transfer surface 44 is within the axial blade depth region. Thus, as will be further described below, the heat transfer surface 44 simultaneously serves as an air pressure differential surface and a heat transfer surface.

Figure 9:
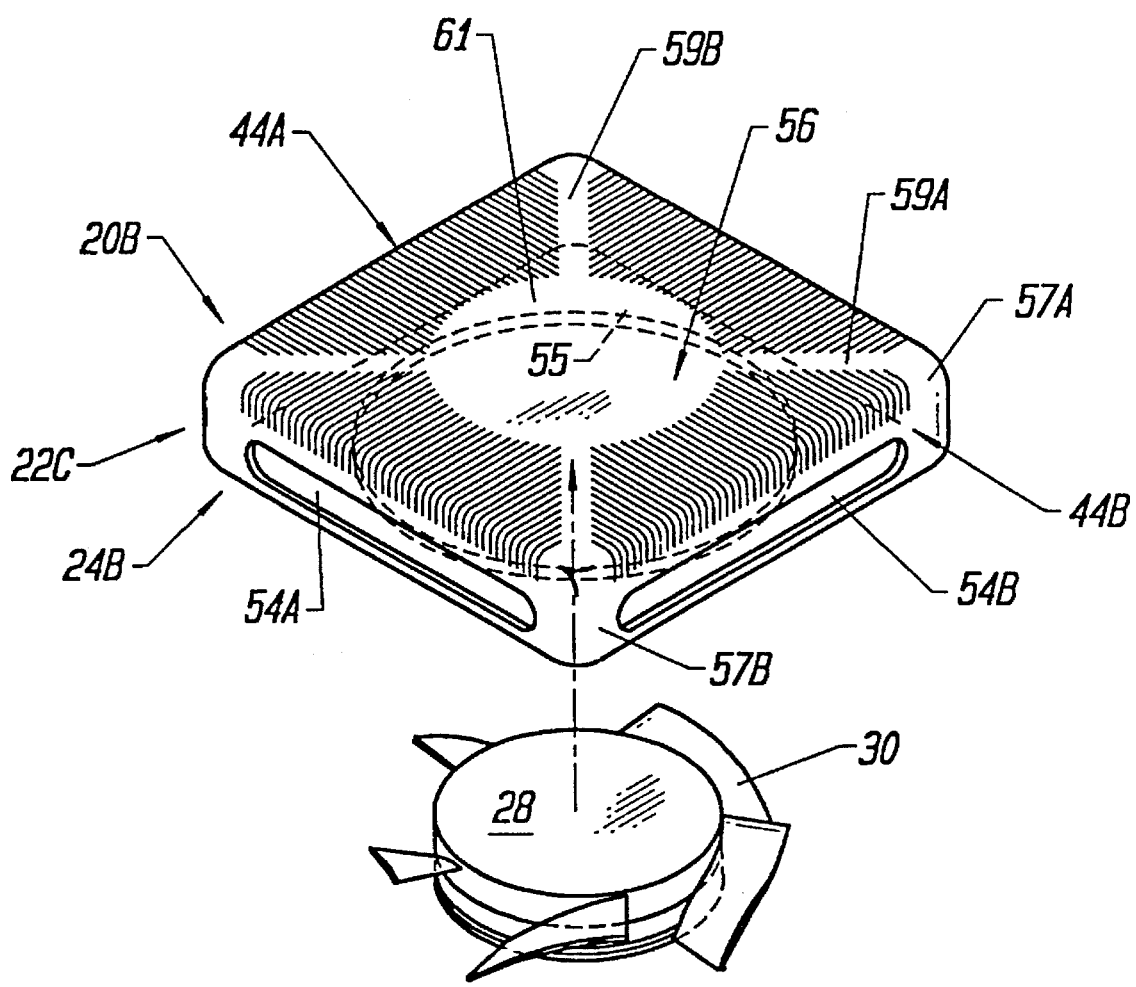
FIG. 9 is an exploded view of another embodiment of the invention including a fan-frame member with an optimized heat transfer surface which is positionable with a fan-base member defining large air flow apertures.

FIG. 9 provides still another embodiment 20B of the apparatus of the invention. This embodiment departs from the previous embodiments in that it does not include a discrete air pressure differential surface. Rather, the optimized heat transfer surface assumes this function, as will be described below.

As depicted in FIG. 9, the fan-frame member 22C and the fan-base member 24B are formed as a unitary fan body 20B. The fan-base member 24B includes large elongated apertures 54. The fan-base member 24B also includes a base surface 55 which defines a fan insertion aperture 56, as illustrated in phantom is FIG. 9. Fan 28 is placed through the fan insertion aperture 56, and is secured by conventional mechanisms. The fan-frame member 22C includes horizontal optimized heat transfer surfaces 44A, which may extend into vertical optimized heat transfer surfaces 44B. Variations of this design are feasible. For instance, the horizontal heat transfer surfaces 44 may be limited to the top of the fan frame member 22C, or the heat transfer surfaces 44 may extend to the base of the fan-base member 24B into the base surface 55, effectively forming a cage-like structure.

In preferable operation of the apparatus of FIG. 9, air enters through the optimized heat transfer surfaces 44A and 44B and leaves through elongated apertures 54. Note that in this embodiment, the optimized heat transfer surface 44 serves as both a heat transfer surface and a pressure differential surface. That is, due to the proximity of the fan frame 22C to the fan blades 30, the heat transfer surface can be exploited as a pressure differential surface. Also note that in this embodiment, the fan 28 is effectively positioned directly on the heat source and the heat transfer surface 44 is above, and in close proximity to the fan. In the prior art, heat transfer surfaces are coupled directly to a heat source and a fan is positioned above the heat transfer surfaces.

With the structure of FIG. 9, heat produced by a heat generating device is conducted from the base 55 through vertical heat conduction limbs 57. From the vertical heat conduction limbs 57, the heat is conducted through heat conduction channels 59 into the central heat conduction region 61 formed on the top of the fan-frame member 22C. Note that the vertical heat conduction limbs 57, heat conduction channels 59, and central heat conduction region 61 each have peripheral contact with a heat transfer surface 44, and thereby transfer heat to the heat transfer surface for efficient heat exchange (removal).

In an alternate embodiment of the invention, fan 28 is directly mounted on the underside of heat conduction region 61. A receptacle may be formed within the heat conduction region 61 or a plateau may be formed to mount the fan 28. In either case, the fan blades are received within the heat transfer passageway defined through the fan-base member 24B, and the fan-base member and fan define substantially equal dimensions in the fan's axial direction, giving the overall fan body a low axial profile in accordance with the present invention.

Figure 10:
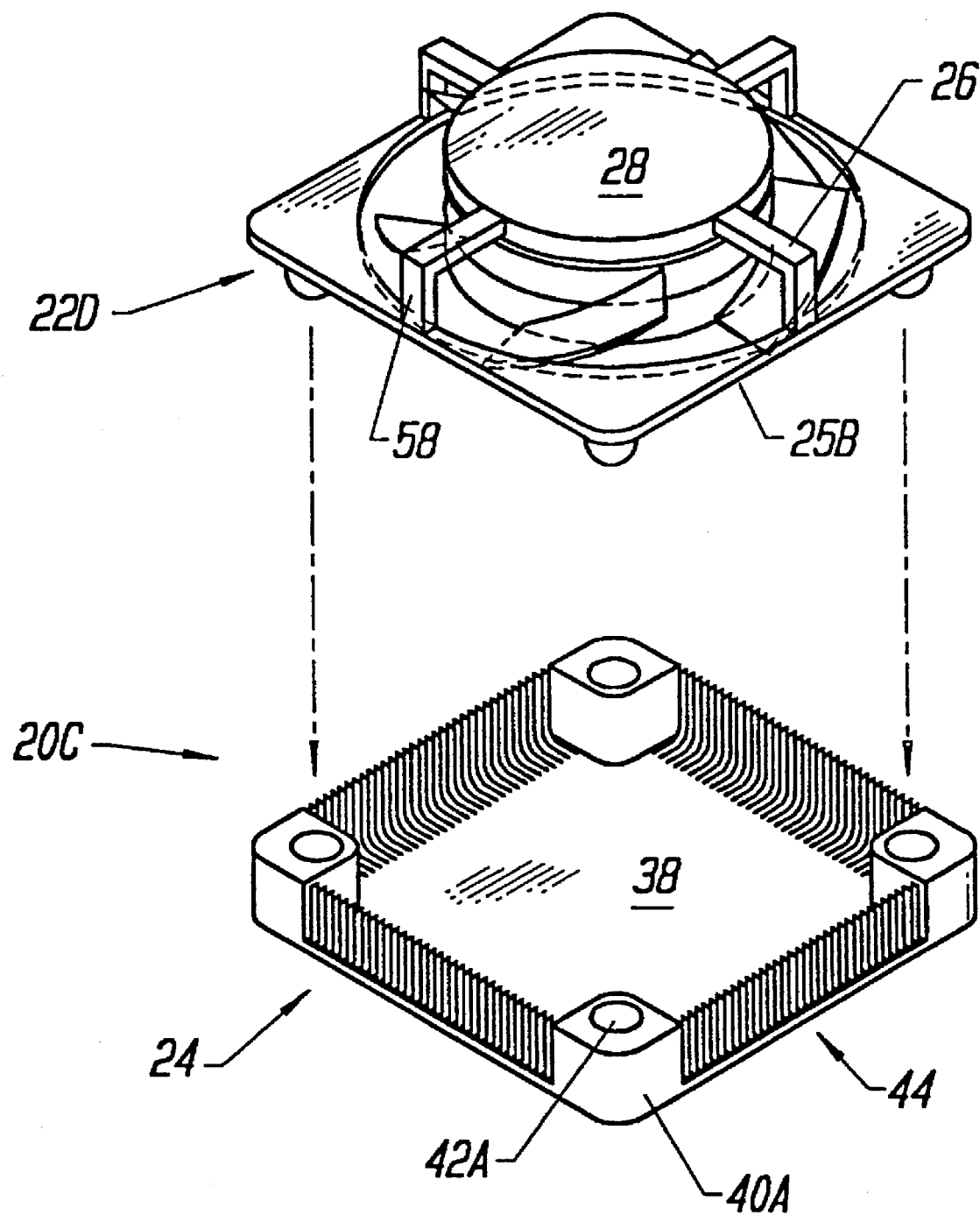
FIG. 10 is an exploded view of another embodiment of the invention illustrating the fan-base member and the fan-frame member supporting a fan within the fan-base region.

FIG. 10 provides still another embodiment of an apparatus in accordance with the present invention. The apparatus 20C includes a fan base 24 of the type previously described in relation to FIG. 1. However, in this device an alternate fan-frame 22D is employed. As depicted, the fan-frame 22D has a thin fan-frame body 25B. Vertical supports 58 are positioned on the fan-frame body 25B to support struts 26, which, in turn, support fan 28. In this embodiment, the fan blades 30 extend into the axial region defined by the optimized heat transfer surfaces 44. As in the previous embodiment, the optimized heat transfer surfaces 44 have the dual function of heat transfer surfaces and air pressure differential surfaces. The finely pitched posts 45 are closely positioned next to the fan blades 30. The density of the finely pitched posts 45 allow them to serve as a pressure differential surface, while still maintaining their heat transfer characteristics.

Figure 11:
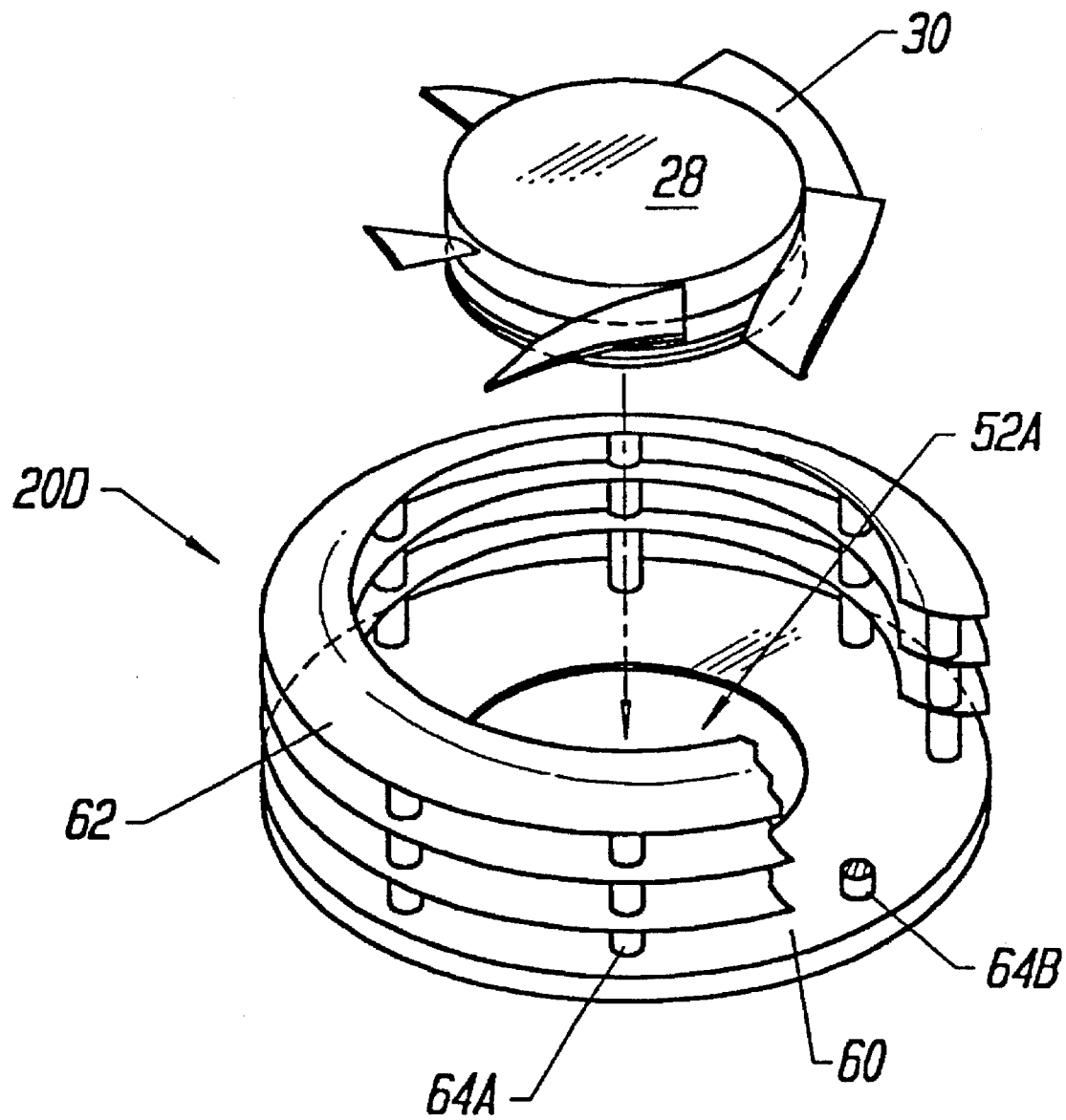
FIG. 11 is a perspective view of another embodiment of a low profile fan body of the invention including a plurality of vertically displaced heat transfer rings which simultaneously serve as a heat transfer surface and a pressure differential surface.

FIG. 11 provides another embodiment of a low profile fan body 20D with favorable heat transfer characteristics. The body 20D includes a circular foundation 60 which defines a fan receptacle 52A. As depicted, a fan 28 is positioned within the fan receptacle 52A. The body 20D also includes a number of studs 54 which support a number of vertically displaced rings 62, which in combination constitute an optimized heat transfer surface 44 and air pressure differential surface 34. In other words, due to the geometric proximity of the vertically displaced rings 56 to one another and to the fan blades 30, they serve the dual purpose of forming an optimized heat transfer surface and an air pressure differential surface. In a preferable embodiment, there are between 10 and 20 vertically displaced rings 62, optimally, there are approximately 15 such rings. The distance between rings is preferably between 0.25 millimeters and 1.0 millimeters, preferably the distance is approximately 0.7 millimeters. Preferably, each ring 62 has a geometry that enhances its pressure differential capacity. In other words, a ring 62 preferably includes an arc-like cross-section.

Note that in FIG. 11, studs 54 should be formed of a heat conductive material, preferably a metallic material, and therefore form a heat conduction path from the circular foundation 60, through the studs 54, and into the rings 62.

Returning to FIG. 1, the heat transfer body or fan-base member 24 is preferably formed from a highly conductive material such as aluminum. The aluminum is originally cast by conventional methods and is then machined by standard techniques to form the finely pitched posts 45. In one successful embodiment of the invention, the finely pitched posts 45 had a thickness of 0.18 millimeters, with a slot region of 0.53 millimeters between each post. The fan-frame member 25 is preferably formed from a reasonably heat conductive material, such as plastic, aluminum, or zinc. In one successful embodiment of the invention, a tube axial fan 28 with a rotational blade diameter of 38 millimeters is used. Such a fan may operate at approximately 6000 rpm's and consume approximately 0.8 watts. The total depth of the fan body 20 is preferably less than 13 millimeters. The horizontal dimensions of the fan body 20 are preferably proportional to the microprocessor, power supply, or other heat generating device with which it is used.

Figure 12:
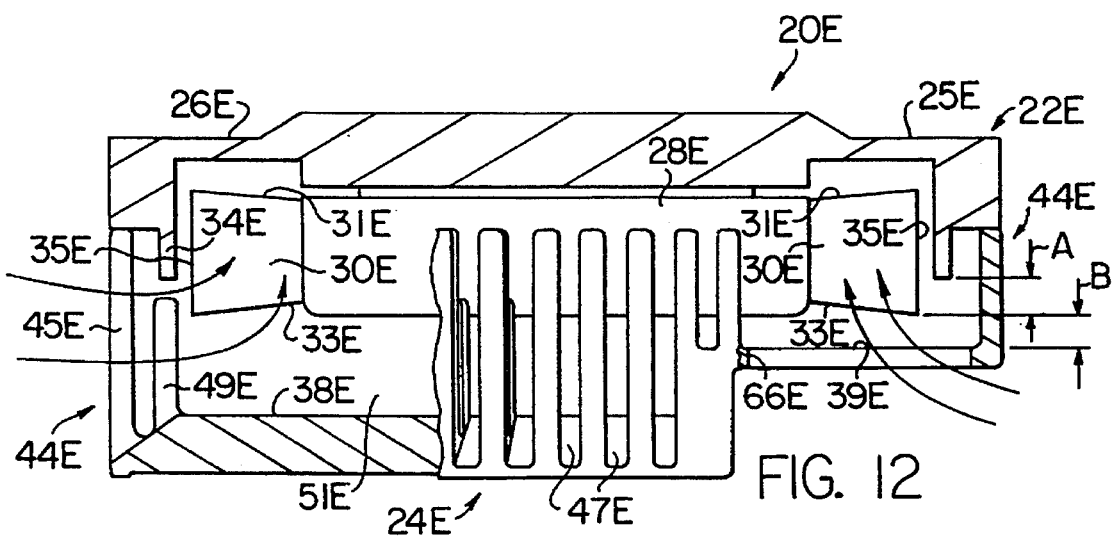
FIG. 12 is an elevational view, in partial cross section, of another embodiment of a low profile fan body of the present invention wherein the fan base includes first and second rows of heat transfer posts or fins.

Turning to FIGS. 12–16, another embodiment of the low profile fan body of the present invention is indicated generally by the reference numeral 20E. The fan body 20E includes a fan frame 22E which is detachably mounted to the heat transfer body or fan base 24E, as is described further below. Like the fans described above, the fan 28E includes a plurality of fan blades 30E radially spaced about the axis of the fan, and each defining a first axial edge 31E, a second axial edge 33E, and a radial edge 35E. The fan frame 22E includes an air pressure differential surface 34E, which in this embodiment surrounds the fan 28E, and is located between the fan blades and the heat transfer surface 44E. As shown in FIG. 12, the pressure differential surface 34E extends in the axial direction of the fan through only a first portion of the axial blade depth region defined by the blades 30E, thus exposing at least a portion of the radial edges 35E located in a second portion of the axial blade depth region to the adjacent heat transfer surface 44E of the fan base 24E.

As will be recognized by those skilled in the art, the pressure differential surface 34E may surround only a portion of the periphery of the fan blades. In this situation, the heat transfer surface 44E may be spaced in close proximity to the radial edges of the fan blades between sections of the pressure differential surface to form a part of the pressure differential surface. If the pressure differential surface 34E is eliminated entirely, then the heat transfer surface 44E is preferably spaced in close proximity to the radial edges of the fan blades, and appropriately shaped to perform the function of the pressure differential surface in addition to the heat transfer function, as described above.

Figure 14:
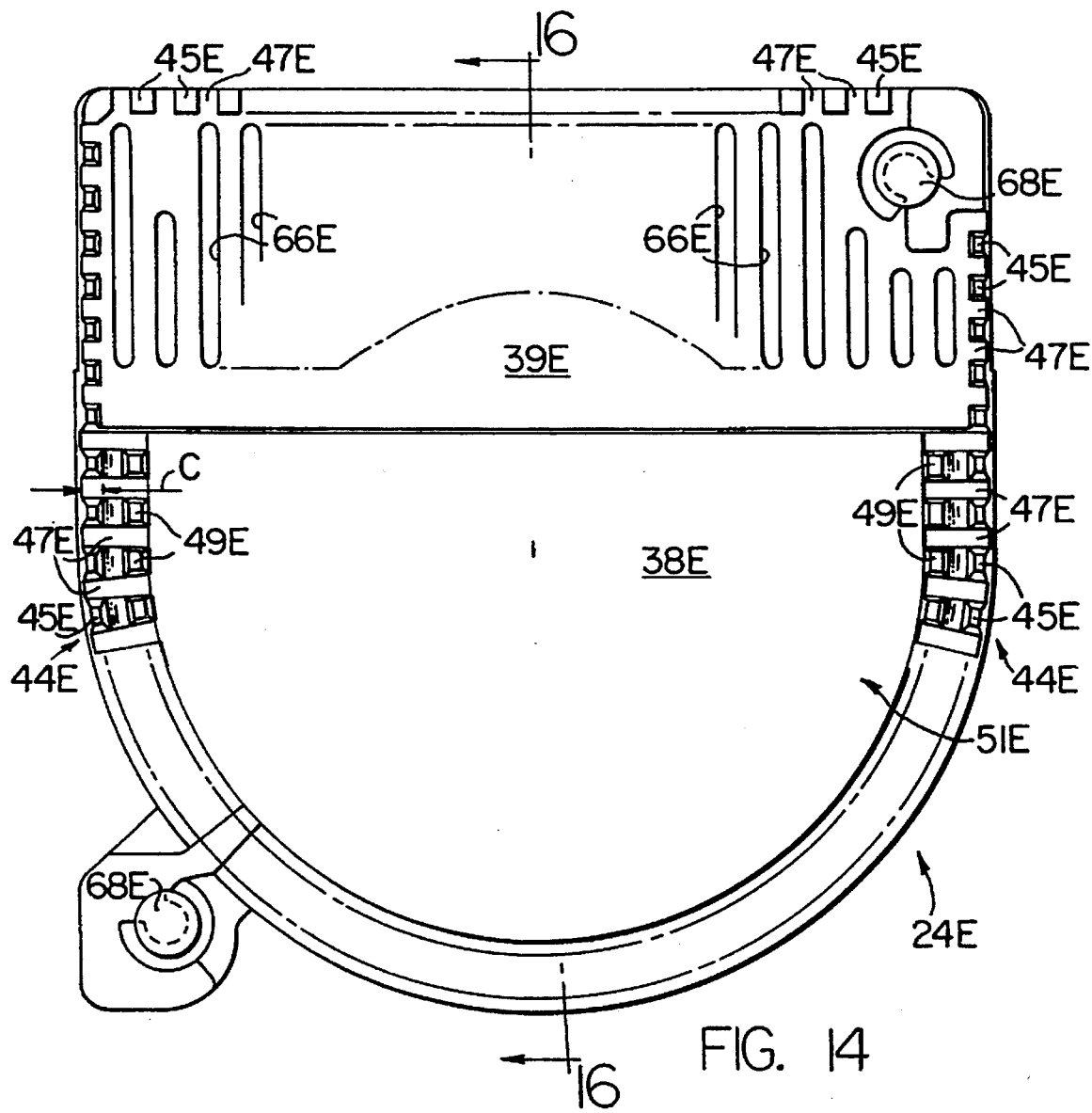
FIG. 14 is a top plan view of the fan base or heat transfer body of the low profile fan body of FIG. 12.

Turning to FIGS. 14–16, the interface surface 38E of the fan base 24E defines an elevated, substantially flat shelf portion 39E for accommodating surface-mounted components on the microprocessor or other electronic component (not shown). As shown in FIG. 14, the shelf portion 39E defines a substantially rectangular periphery, whereas the remaining portion of the interface surface 38E defines a substantially semi-circular periphery. The optimized heat transfer surface 44E is formed by a first row of heat posts or fins 45E substantially equally spaced relative to each other along the peripheral edge of the interface surface 38E, and a second row of heat posts or fins 49E spaced inwardly from the first row of fins 45E, and substantially equally spaced relative to each other along the periphery of the semi-circular portion of the interface surface. As shown best in FIG. 14, each inner row fin 49E is aligned with a respective outer row fin 45E, thus extending the slots 47E through both the inner and outer rows of fins.

Like the embodiments of the invention described above, the heat transfer surface 44E and interface surface 38E define a plenum chamber 51E for receiving the blades 30E of the fan, and forming a heat transfer passageway for the flow of cooling air through the fan. As shown in FIG. 12, the second axial edges 33E of the fan blades are spaced away from the uppermost portion of the interface surface in the axial direction of the fan, which in this embodiment of the invention is the shelf portion 39E, by a distance A. The distance A is selected so that the second axial edges 33E are spaced in close proximity to, but sufficiently away from the interface surface to prevent choking or cavitation between the fan blades and the interface surface, and thereby permit air flow across the second axial edges of the fan blades, as illustrated typically by the arrows in FIG. 12.

As also shown typically in FIG. 12, the outer corners of the second axial edges 33E are preferably spaced below the bottom edge of the pressure differential surface 34E by a distance B. The distance B is selected to expose at least a portion of the radial edges 35E of the fan blades to the heat transfer surface 44E, and thereby permit the flow of cooling air across the radial edges of the blades, as indicated typically by the arrows in FIG. 12. Thus, as with the embodiments of the invention described above, the flow path for cooling air is defined across both the first and second axial edges 31E and 33E, and across at least a portion of the radial edges 35E of the fan blades, as indicated typically by the arrows in FIG. 12.

As will be recognized by those skilled in the art, the distances A and B may be adjusted depending upon the characteristics of the fan and other features of a particular fan body to enhance or maximize the cooling capacity. For example, the smaller the distance A, the larger may be the distance B, or vice-versa, in order to define an open area through the heat transfer surface 44E to generate a sufficient air flow to obtain a required cooling capacity. In the embodiments of the present invention illustrated, the distance A is minimized so that the fan blades are substantially entirely received within the plenum chamber, and the fan and fan base define substantially equal dimensions in the axial direction of the fan, thereby minimizing the vertical (or axial) profile of the fan body. As described above, the distance A must be sufficient, however, to substantially prevent choking or cavitation between the fan blades and the interface surface. As may also be recognized by those skilled in the art, the fan 28E may be constructed to direct air flow in the opposite direction illustrated by the arrows in FIG. 12, i.e., in the direction from the apertures 46E in the fan housing toward the interface surface 38E, beneath the pressure differential surface 34E, and in turn through the slots 47E in the heat transfer surface.

With reference to FIG. 14, the shelf portion 39E of the interface surface defines a plurality of elongated slots 66E therethrough. The slots 66E are substantially equally spaced relative to each other, and in the central area of the shelf portion 39E, the slots are progressively shorter in their elongated direction. The shelf portion 39E is preferably spaced away from, but in close proximity to the surface mounted components of the microprocessor (not shown) to permit cooling air to flow across the surfaces of the components, and in turn through the slots 66E in the axial direction of the fan, as indicated typically by the arrow in FIG. 12. The shelf portion 39E thus, in effect, forms a grid overlying the surface mounted components of the microprocessor in order to permit cooling air to flow therethrough to cool the components.

One advantage of this embodiment of the present invention, is that the second row of cooling fins 49E significantly enhances the cooling capacity of the fan body. As shown in FIG. 12, in this embodiment of the invention, the inner row of fins 49E are shorter in the fan's axial direction than the outer row of fins 45E. The outer fins 45E project from the interface surface 38E in the fan's axial direction, and terminate substantially the same distance from the interface surface as the fan blades 30E. The inner fins 49E, on the other hand, preferably terminate in the lower portion of the axial blade depth region defined by the distance B. In this embodiment of the invention, the top surfaces of the inner fins 49E are spaced below the bottom edge of the pressure differential surface 34E to permit the passage of cooling air between the inner fins and the pressure differential surface.

The shapes, relative dimensions and spacing of the inner and outer fins of the present invention, permit the fan base 24E to be manufactured more cost effectively, e.g., by die cast or forging processes, in comparison to other fan bases requiring intricate, and relatively expensive machining to form the heat transfer fins. Typically, the number of fins is maximized, while the width of each fin, and the spacing between adjacent fins is minimized within the limits of the particular manufacturing process utilized to make the fan base, in order to enhance or optimize the cooling capacity of the fan body.

As shown in FIG. 14, each inner and outer fin 45E and 49E has four side faces, and each face defines approximately the same width C. With reference to FIGS. 15 and 16, each slot 47E between adjacent fins defines a width D, and the inner and outer fins are spaced relative to each other by a distance E in substantially the radial direction of the fan. As will be recognized by those skilled in the art, the dimensions C, D and E, along with the shapes of the fins may be adjusted to enhance or optimize the cooling capacity of a particular fan or fan body configuration. As described above, however, the width C of each side face, and the widths D and E of each gap are minimized, while the number of fins is maximized within the limits of the manufacturing process used to make the fan base. In this embodiment of the invention, the width C of each fin is at least approximately 1.0 mm, and is preferably within the range of approximately 1.0 to 1.5 mm, and the widths D and E of each gap are at least approximately 1.0 mm.

As shown in FIGS. 14–16, the side surfaces of each inner and outer fin 45E and 49E define a slight taper (or draft) in order to enable the fan base to be manufactured by die casting, forging, or like process. As shown typically in FIG. 15, each side face of each inner and outer fin defines a draft angle F with respect to a vertical (or axial) plane, and tapers inwardly from the base of each fin toward its distal end. In this embodiment of the invention, each draft angle F is at least approximately 0.5°, and is preferably within the range of approximately 0.5° to 1.5°. As shown in FIG. 14, in the semi-circular section of the fan base, each inner and outer fin defines a substantially trapezoidal shape in plan, in order to maintain a substantially uniform width D throughout each slot 47E.

As also shown in FIG. 15, the portions of the interface surface 38E between adjacent fins 45E and 49E slope downwardly from the inside edges of the inner fins 49E toward the outer, bottom edge of the fan base 24E in order to enhance the thermal conductivity, and thus the cooling capacity of the base.

Depending upon the particular performance characteristics of the fan 28, and the space requirements of the fan body, the dimensional variables of the fan base can be adjusted to optimize the cooling capacity, while minimizing the size of the fan body. By adding the second row of fins 49E, for example, the overall footprint of the fan base can be reduced in comparison to a fan base having a single row of such fins, while achieving the same or better cooling capacity. Also if desired, the fan base can be given a partial curved periphery, such as the semi-circular periphery illustrated in FIG. 14, or other curved shape, while achieving the same or better cooling capacity as other rectangular-shaped fan bodies, or other fan bodies having machined fins. The multiple-row fin configuration of the present invention may also be employed with rectangular or other more conventional-shaped fan bodies to increase the cooling capacity, and/or to decrease the footprint of the fan body. It may also be desirable to increase or decrease the lengths of the inner fins relative to the outer fins and/or the pressure differential surface, or to add a third row of fins spaced inwardly relative to the second row of fins to enhance the cooling capacity. In sum, significant advantages can be obtained in reducing the overall size of the fan body, and reducing the manufacturing cost of the fan body, while enhancing or maintaining the cooling capacity, by employing the fin configuration of the present invention.

The fan body 20E also includes means for detachably mounting the fan frame 22E to the fan base 24E to permit relatively easy and rapid removal and replacement of the fan frame and fan 28 upon failure of the fan. The means for detachably mounting is preferably the same as, or equivalent to such means disclosed in co-pending U.S. patent application Ser. No. 08/192,264, entitled "DETACHABLE APPARATUS FOR COOLING INTEGRATED CIRCUITS", filed in the name of John W. Hoover on Feb. 7, 1994, and assigned to Nidec Corporation, which is hereby expressly incorporated by reference as part of the present disclosure.

Figure 13:
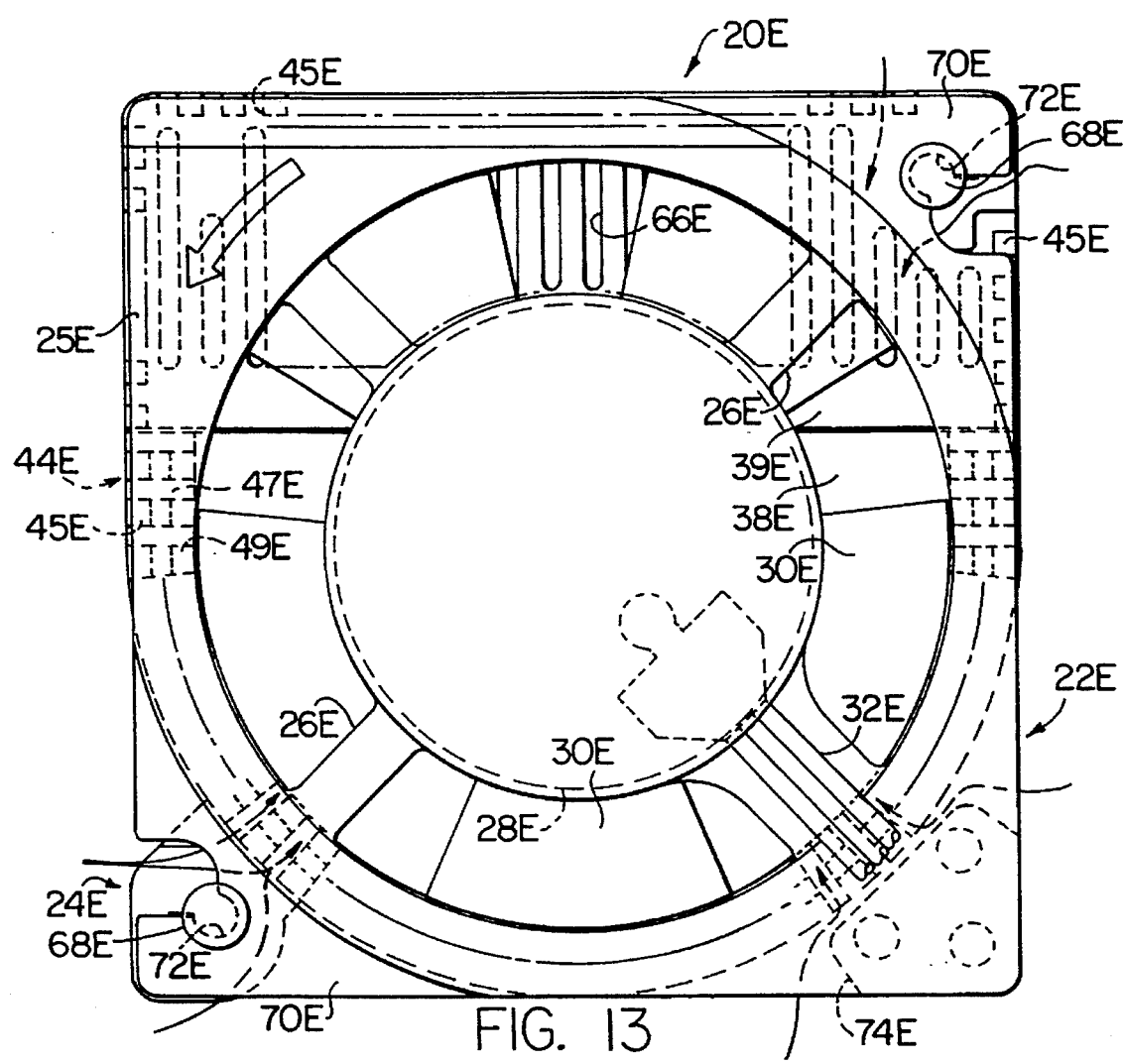
FIG. 13 is top plan view of the low profile fan body of FIG. 12.

As shown in FIGS. 13 and 14, the fan base 24E includes a pair of mounting posts 68E located on substantially opposite sides of the fan base relative to each other, and projecting in a direction normal to the interface surface 38E. The fan frame 22E includes a pair of corresponding flanges 70E, each defining a mounting aperture 72E (shown in phantom) for receiving a respective mounting post 68E. Each mounting aperture 72E is dimensioned to form an interference fit with the corresponding mounting post 68E to receive and hold the mounting post firmly in place.

The fan frame 22E is detachably mounted to the fan base 24E by placing the fan frame onto the fan base, and orienting the fan frame so that the flanges 70E and mounting apertures 72E are rotated slightly with respect to the mounting posts 68E, and the fan 28E is received within the plenum chamber 51E. The fan frame 22E is then rotated about the axis of the fan relative to the fan base 24E, so that the flanges and apertures are rotated toward the corresponding mounting posts, and the mounting posts are each received within the respective mounting aperture. Because each mounting aperture is dimensioned to form an interference fit with the respective mounting post, the mounting posts are firmly retained within the mounting apertures, and the fan frame and fan are thereby firmly attached to the fan base. If the fan fails, or otherwise needs repair or replacement, the fan is removed by simply rotating the fan frame in the opposite direction, as indicated by the arrow in FIG. 13, to release the mounting posts from the mounting apertures.

As shown in phantom in FIG. 13, the fan frame 22E may include an integral electrical connector 74E mounted on one corner of the fan frame, and electrically coupled to the lines 32E for controlling operation of the fan. The integral connector 74E may be of the same type as disclosed in the above-mentioned co-pending patent application, and preferably includes connector surfaces, as indicated in phantom in FIG. 13, for automatically forming an electrical connection with corresponding surface pads or connectors on the microprocessor (not shown) upon attachment of the fan frame to the fan base, or upon attachment of the fan body to the microprocessor. As also shown in FIG. 13, the electrical connector 74E is preferably spaced away from the outer row of fins 45E to permit cooling air to flow between the connector and the fins, and in turn into the plenum chamber 51E, as indicated typically by the arrows in FIG. 13.

With reference to FIG. 13, each mounting post 68E is preferably spaced sufficiently away from the adjacent outer fins 45E to permit the passage of cooling air between the mounting posts and the fins, as indicated typically by the arrows in FIG. 13. Another advantage of the present invention, therefore, is that cooling air is permitted to flow into the fan base along the entire periphery of the fan, in contrast to prior art fan bodies, wherein the mounting structures for the fan frames typically block substantial peripheral areas of the fan base and prevent the passage of cooling air therethrough.

Another advantage of the present invention, is that the multiple-row fin configuration permits the peripheral shape of the fan base to be modified and/or reduced in footprint size while achieving the same or better cooling capacity in comparison to prior art fan bodies. For example, with reference to FIG. 13, the semi-circular peripheral shape of the fan base 24E permits the integral connector to be mounted on one corner of the fan frame, and the mounting apertures for the mounting posts to be formed on two other corners of the fan frame, without increasing the footprint of the fan body in comparison to a comparable prior art fan body having a rectangular shape and a single row of machined fins. The multiple-row fin configuration of the present invention thus permits the overall footprint of a fan body to be reduced, or permits additional components to be mounted on the fan body without increasing its footprint, while maintaining or enhancing the cooling capacity.

The foregoing descriptions of specific embodiments of the present invention are presented for purposes of illustration and description. They are not intended to be exhaustive or to limit the invention to the precise forms disclosed, and obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. An apparatus for cooling an electronic component having an exposed surface, comprising:

means for moving air to cool the electronic component; and a heat transfer body defining a base portion for engaging the exposed surface of the electronic component, and a heat transfer passageway receiving the air moving means to move air through the passageway and cool the electronic component, the heat transfer body including at least one heat transfer surface disposed in the heat transfer passageway to enhance the heat transfer capacity of the heat transfer body, and the heat transfer body and air moving means defining substantially equal dimensions in an axial direction of the air moving means.

2. An apparatus as defined in claim 1, wherein the air moving means defines a device depth region in the axial direction thereof, and the apparatus further comprises a pressure differential surface extending along at least a portion of the periphery of the air moving means, and extending in the axial direction of the air moving means through a first portion of the device depth region.

3. An apparatus as defined in claim 2, wherein the at least one heat transfer surface is defined by a plurality of heat transfer members projecting from the base portion through a second portion of the device depth region located between the first portion of the device depth region and the exposed surface of the electronic component.

4. An apparatus as defined in claim 1, wherein the air moving means comprises a fan assembly including a plurality of fan blades radially disposed about an axis of the fan assembly.

5. An apparatus as defined in claim 4, wherein the at least one heat transfer surface includes a plurality of heat transfer members projecting from the base portion in substantially the axial direction of the fan assembly and terminating in the axial direction of the fan assembly substantially the same distance from the base portion as the fan blades.

6. An apparatus as defined in claim 4, wherein the heat transfer body projects from the exposed surface of the electronic component in substantially the axial direction of the fan assembly, and terminates in the axial direction of the fan assembly substantially the same distance from the exposed surface as the fan assembly.

7. An apparatus as defined in claim 1, wherein the base portion defines an aperture therethrough in communication with the heat transfer passageway.

8. An apparatus as defined in claim 1, wherein the air moving means comprises a fan assembly including a frame coupled to the heat transfer body, and a fan rotatably mounted on the frame, the fan including a plurality of fan blades at least partially received within the heat transfer passageway.

9. An apparatus as defined in claim 8, wherein the frame includes several posts, and the heat transfer body defines several corresponding apertures for receiving the posts upon mounting the fan assembly to the heat transfer body.

10. An apparatus as defined in claim 1, wherein the at least one heat transfer surface includes a plurality of heat transfer members projecting from the base portion in substantially the axial direction of the air moving means, and spaced relative to each other adjacent to at least a portion of the approximate periphery of the air moving means.

11. An apparatus as defined in claim 10, wherein the heat transfer members form a discontinuous pressure differential surface adjacent to the periphery of the air moving means.

12. An apparatus as defined in claim 1, wherein the base portion defines a receptacle for receiving and supporting the air moving means.

13. An apparatus as defined in claim 12, wherein the air moving means includes a fan rotatably mounted within the receptacle.

14. An apparatus as defined in claim 1, wherein the heat transfer body includes a plurality of first heat transfer surfaces spaced relative to each other in a plane substantially perpendicular to the axis of the air moving means.

15. An apparatus as defined in claim 14, wherein the heat transfer body includes at least one second heat transfer surface extending substantially in the axial direction of the air moving means between at least one first heat transfer surface and the base portion.

16. An apparatus as defined in claim 15, wherein the at least one second heat transfer surface defines an elongated aperture in communication with the heat transfer passageway for the flow of air therethrough by the air moving means.

17. An apparatus as defined in claim 14, wherein the base portion defines a receptacle for receiving and supporting the air moving means.

18. An apparatus as defined in claim 17, wherein the air moving means includes a fan rotatably mounted within the receptacle.

19. An apparatus as defined in claim 1, wherein the air moving means comprises a fan assembly including a frame member coupled to the heat transfer body, and a fan coupled to the frame member, the fan including a plurality of fan blades at least partially received within the heat transfer passageway.

20. An apparatus as defined in claim 19, wherein at least one of the frame member and the heat transfer body defines at least one mounting aperture, and the other of the frame member and heat transfer body defines at least one corresponding mounting member received within the mounting aperture to mount the air moving means on the heat transfer body.

21. An apparatus as defined in claim 1, comprising a plurality of heat transfer members forming the at least one heat transfer surface, the heat transfer members being spaced relative to each other in substantially the axial direction of the air moving means adjacent to the periphery of the air moving means.

22. An apparatus as defined in claim 21, wherein the plurality of heat transfer members substantially surround the air moving means, and define a plurality of elongated apertures between adjacent heat transfer members.

23. An apparatus as defined in claim 22, wherein each heat transfer member defines a curved heat transfer surface extending adjacent to the periphery of the air moving means.

24. An apparatus as defined in claim 21, further comprising a plurality of heat transfer posts extending between adjacent heat transfer members and supporting the heat transfer members in spaced relationship relative to each other.

25. An apparatus for cooling an electronic component having an exposed surface, comprising:

a fan including a plurality of fan blades radially spaced relative to each other about an axis of the fan, each fan blade defining a first axial edge, a second axial edge on a substantially opposite side of the blade relative to the first axial edge, and a radial edge between the first and second axial edges;

a heat transfer body defining a base portion for engaging the exposed surface of the electronic component, a plurality of heat transfer members projecting from the base portion in substantially the axial direction of the fan and defining a plenum chamber receiving the plurality of fan blades; and a pressure differential surface disposed adjacent to the radial edges of a plurality of the fan blades, the radial edges of a plurality of the fan blades being at least partially exposed to the adjacent heat transfer members thereby defining an air flow path across the radial edges of the fan blades exposed to the heat transfer members, and the first axial edges of the fan blades being located adjacent to and spaced from the base portion of the heat transfer body further defining an air flow path between the first axial edges and the base portion.

26. An apparatus as defined in claim 25, wherein the heat transfer body includes a first row of heat transfer members spaced relative to each other adjacent to a peripheral edge of the heat transfer body.

27. An apparatus as defined in claim 26, wherein the heat transfer body includes a second row of heat transfer members spaced inwardly from the peripheral edge relative to the first row of heat transfer members.

28. An apparatus as defined in claim 27, wherein each second row heat transfer member is substantially aligned with a respective first row heat transfer member forming a plurality of gaps between adjacent first and second row heat transfer members for the passage of cooling air therethrough.

29. An apparatus as defined in claim 27, wherein a plurality of the second row heat transfer members are shorter in the axial direction of the fan than the adjacent first row heat transfer members.

30. An apparatus as defined in claim 29, wherein the fan blades define an axial blade depth region, and the first row heat transfer members extend through first and second segments of the axial blade depth region, and the second row heat transfer members extend through only the second segment of the axial blade depth region.

31. An apparatus as defined in claim 27, wherein a plurality of the second row heat transfer members are spaced below the pressure differential surface, thereby defining a passageway for cooling air between the ends of the second row heat transfer members and the pressure differential surface.

32. An apparatus as defined in claim 27, wherein the heat transfer body defines a curved peripheral contour.

33. An apparatus as defined in claim 32, wherein the heat transfer body defines a semi-circular peripheral contour.

34. An apparatus as defined in claim 27, wherein the base portion of the heat transfer body includes an interface surface defining a first portion, and a second portion spaced closer to the second axial edges of the fan blades than the first portion for accommodating surface mounted components on the electronic component, the second portion of the interface surface defining at least one aperture therethrough for the flow of cooling air over the surface mounted components and in substantially the axial direction of the fan.

35. An apparatus as defined in claim 34, wherein the second portion of the interface surface defines a plurality of elongated apertures spaced relative to each other and extending therethrough, the elongated apertures forming a plurality of passages for the flow of cooling air over the surface mounted components and in substantially the axial direction of the fan.

36. An apparatus as defined in claim 25, wherein a plurality of the heat transfer members terminate in the axial direction of the fan substantially the same distance from the base portion as the fan blades.

37. An apparatus as defined in claim 25, wherein the heat transfer body terminates in the axial direction of the fan substantially the same distance from the exposed surface as the fan.

38. An apparatus as defined in claim 25, wherein one of the fan and the heat transfer body includes at least one mounting post to mount the fan to the heat transfer body, and the mounting post is spaced away from the adjacent heat transfer members thereby defining a passageway for the flow of cooling air between the mounting post and the heat transfer members.

39. An apparatus as defined in claim 38, wherein the heat transfer members form at least one row extending adjacent to a peripheral edge of the heat transfer body, and the heat transfer members of the row adjacent to the mounting post are spaced inwardly substantially toward the axis of the fan relative to the mounting post thereby defining the passageway for the flow of cooling air therebetween.

40. An apparatus as defined in claim 25, wherein the base portion defines a receptacle for receiving and supporting the fan.

41. An apparatus as defined in claim 26, wherein the surfaces of the base portion between adjacent first row heat transfer members slopes outwardly toward the exposed surface of the electronic component.

42. An apparatus as defined in claim 25, further comprising a fan frame carrying the fan and mounted on the heat transfer body, and an electrical connector mounted on the fan frame for forming an electrical connection with the electronic component, the electrical connector being located on an opposite side of a plurality of adjacent heat transfer members relative to the fan blades, and being spaced away from the heat transfer members, thereby defining a passageway for cooling air between the connector and the adjacent heat transfer members and into the plenum chamber.

43. An apparatus as defined in claim 25, wherein adjacent heat transfer members are spaced at least approximately 1 mm relative to each other.

44. An apparatus as defined in claim 25, wherein each heat transfer member defines a plurality of side surfaces, and each side surface tapers inwardly from the base of the member toward another end of the member at an angle of at least approximately 0.5° with respect to an axial plane.

45. An apparatus as defined in claim 25, wherein the pressure differential surface surrounds the fan blades.

46. An apparatus as defined in claim 25, wherein the fan blades define an axial blade depth region with reference to an axis of the fan, the pressure differential surface is formed within a first portion of the axial blade depth region, and the radial edges of a plurality of the fan blades are exposed to adjacent heat transfer members within a second portion of the axial blade depth region.

* * * * *

UNITED STATES PATENT AND TRADEMARK OFFICE
CERTIFICATE OF CORRECTION

PATENT NO. : 5,484,262
DATED : January 16, 1996
INVENTOR(S) : Thomas et al.

It is certified that error appears in the above-indentified patent and that said Letters Patent is hereby corrected as shown below:

On the title page, item [*]:
Amend the "Notice" to read as follows:

--The portion of the term of this patent subsequent to October 23, 2012 has been disclaimed.--

In column 1, lines 8 and 9, delete
"now U.S. Pat. No 5,288,203 filed Oct. 23, 1992, herewith"
and isnert --filed Oct. 23, 1992, now U.S. Pat. No. 5,288,203--.

Signed and Sealed this

Sixteenth Day of July, 1996

*Attest:*

BRUCE LEHMAN

*Attesting Officer*     Commissioner of Patents and Trademarks